United States Patent [19]

Kirtley et al.

[11] Patent Number: 4,578,283
[45] Date of Patent: Mar. 25, 1986

[54] POLYMERIC BORON NITROGEN DOPANT

[75] Inventors: Stephen W. Kirtley, Sunnyvale, Calif.; George S. Wooster, Hamburg, N.Y.

[73] Assignee: Allied Corporation, Morris Township, Morris County, N.J.

[21] Appl. No.: 659,119

[22] Filed: Oct. 9, 1984

Related U.S. Application Data

[63] Continuation-in-part of Ser. No. 421,945, Sep. 23, 1982, abandoned.

[51] Int. Cl.$^4$ .............................................. C08G 79/08
[52] U.S. Cl. .................................. 427/85; 148/188; 252/500
[58] Field of Search ........................ 427/85; 148/188

[56] References Cited

U.S. PATENT DOCUMENTS

| | | |
|---|---|---|
| 3,052,641 | 9/1962 | McCloskey . |
| 3,102,911 | 9/1963 | Dobratz . |
| 3,166,520 | 1/1965 | English et al. . |
| 3,341,474 | 9/1967 | Bradford et al. . |
| 3,375,274 | 3/1968 | Faust et al. . |
| 3,477,887 | 11/1969 | Ehlenberger ............... 148/188 |
| 3,834,939 | 9/1974 | Beyer ........................... 148/188 |
| 4,229,560 | 10/1980 | Chernikhov et al. . |

FOREIGN PATENT DOCUMENTS

| | | |
|---|---|---|
| 53045744 | 8/1976 | Japan . |
| 975451 | 11/1964 | United Kingdom . |
| 1012317 | 12/1965 | United Kingdom . |
| 1018031 | 1/1966 | United Kingdom . |
| 1050434 | 6/1966 | United Kingdom . |
| 1485484 | 9/1977 | United Kingdom . |
| 309937-S | 3/1969 | U.S.S.R. . |

OTHER PUBLICATIONS

Aubrey, D. W. and M. F. Lappert, "Cyclic Organic Boron Compounds IV", *J. Chem. Soc. 1959*, pp. 2927–2931.

*Primary Examiner*—Paul R. Michl
*Attorney, Agent, or Firm*—Arthur J. Plantamura; Jay P. Friedenson; Richard C. Stewart, II

[57] ABSTRACT

A polymeric borazole is produced by reacting $BCl_3$ and an amine at temperatures between $-60°$ C. and $-5°$ C. in an inert solvent to form an intermediate triaminoborane, and then further polymerizing the intermediate after removal of the amine hydrochloride salt via thermal condensation at a temperature in the range of 380° C. to 420° C. This polymer, in the form of a glassy resin, and other borazole polymers derived by the polymerization of monomers of the formula $$(XBNY)_3$$

wherein X and Y are used to designate the indicated position of H, OH, OR halogen, amino and R, substituents on the polymer and wherein R is selected from the group consisting of alkyl radicals of 1–4C atoms, cyclohexyl, phenyl and methyl and ethyl substituted phenyl radicals is dissolved in toluene or xylene at the 1 to 20% (wt/wt) level. The polymeric solution may be employed in the manufacture of semiconductor components and, as such, the solution may be spun-on silicon wafers to function as a boron impurity source (dopant) in thermal diffusions. Such doped wafers are then used in integrated circuit manufacture.

4 Claims, No Drawings

POLYMERIC BORON NITROGEN DOPANT

DESCRIPTION

This is a continuation-in-part of U.S. patent application Ser. No. 421,945 filed on Sept. 23, 1982, now abandoned.

TECHNICAL FIELD

This invention relates to the use of boron nitrogen polymers as dopant materials used in semiconductor manufacture and more particularly to a dopant adapted to be spun on to a semiconductor substrate and used in integrated circuit manufacture. The dopant comprises a glassy resinous polymer, at least a substantial part of the backbone of which contains borazole (borazine) monomer units, a solution stabilizer, and a surfactant dissolved in an organic solvent.

BACKGROUND OF THE INVENTION

Since the diffusion of boron impurity atoms into silicon is necessary for semiconductor device fabrication, a number of boron containing chemicals and processes to "dope" the boron into the silicon have been proposed. Some of the known prior art products (and processes) are the following:

(1) boron nitride wafers are oxidized in a diffusion furnace to $B_2O_3$ or $HBO_2$, and the oxide is transferred in the vapor phase to the silicon wafer surface or boric oxide wafers can be used directly;

(2) boron tribromide liquid is vaporized and oxidized in the diffusion furnace to $B_2O_3$ which coats the wafers from the vapor phase;

(3) boron trichloride is used as a source of boron ions for use with an ion implanter.

Less commonly used sources of boron include the boron spin-on solutions, (which typically are $B_2O_3$ or a borosilicate glass precursor dissolved in a solvent) borosilicate films deposited by chemical vapor deposition, or diborane ($B_2H_6$) gas, which is used in a procedure similar to that used for $BBr_3$.

While the above are effective boron sources, all have disadvantages. Specifically, ion implantation involves high capital costs, low throughput, and damage to the silicon crystal structure, while boron oxide and related sources involve costly and complicated processes to achieve quality doping and/or create damaged or stained silicon surface.

Although spin-on boron sources offer the advantages of simpler processing, high throughput, and good uniformity of doping across the substrate, the currently available spin-on products suffer from the drawbacks of short shelf-life and high sensitivity toward ambient moisture.

It is thus apparent that a need exists for a spin-on boran dopant system that has a long shelf-life and whose processing and doping performance are not affected by ambient moisture.

SUMMARY OF THE INVENTION

It is an object of the invention to provide a spin-on boron diffusion source which overcomes the problems of prior art while retaining the benefits of the spin-on method. More particularly, the present invention relates to the development of a novel spin-on boron diffusion source material which is derived from a class of boron-nitrogen polymers and offers the following advantages over prior art: (a) low sensitivity to moisture, (b) long shelf-life, (c) little or no surface damage (stains or pitting), (d) high throughput (or diffusion furnace utilization), and (e) high uniformity of doping across the wafer, down the boat (wafer carrier) and run to run.

The polymeric borazoles employed in the invention are polymers derived from the class of materials known as borazines (or borazoles). These borazines are heterocyclic hexatomic ring compounds having the general formula $(XBNY)_3$ with the substituents X and Y on the ring designated with "B" and "N" prefixes, respectively, to indicate the positions.

The polymers derived from the borazines are of two general types:

(1) polymers with borazine rings linked directly between a boron in one ring and a nitrogen atom in the adjacent ring.

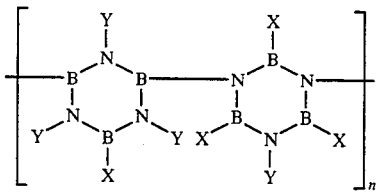

and (2) polymers, at least a substantial portion of whose backbone is borazine rings linked via other (different) groups Z, i.e.:

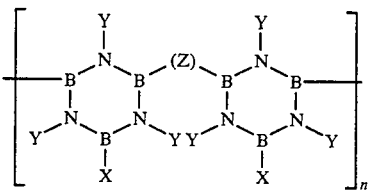

wherein Z is selected from the group consisting of $-N(R)-$, $-O-$, $-N(R)-R^1-N(R)-$, $-R-$, and wherein R and $R^1$ denote organic radicals of 1 to 10 carbon atoms and X and Y are radicals selected from the group consisting of hydrogen, alkyl radicals of 1-8 carbon atoms, unsubstituted aromatic, alkyl-, halogen-, hydroxy-, and amino-substituted aromatic radicals, heterocyclic aromatic, 1-6 carbon atom alkyl substituted heterocyclic aromatic, amino, hydroxy, alkoxy and halogen radicals.

These borazine polymers can be produced as homopolymers from a single monomeric borazine or as copolymers from two different borazines.

Advantageously, the polymer to be useful must be homogeneous and soluble so that it is easily distributed uniformly on the surface, such as by the spin-on method; it must be relatively non-volatile so that when the solvent is removed and the material heated to diffusion temperatures the desired film will be substantially intact; it must be capable of being rendered insoluble i.e., cross linked thermally or otherwise; and it must be characterized as glassy rather than crystalline.

The invention comprises the method of carrying out the polymerization reaction to produce a material suitable for use as a boron diffusion source in the form of a spin-on solution. It further comprises the preparation of the spin-on solution itself, which entails the incorporation of certain additives to the solution for the purpose of imparting such characteristics to the solution as are required for forming defect-free uniform films of borazole polymer on semiconductor substrates by the spin-on technique.

DESCRIPTION OF THE PREFERRED EMBODIMENTS

In preparing the polymeric dopant composition in accordance with the invention a polymeric borazole is produced by first reacting $BCl_3$ and an amine at temperatures between $-60°$ and $-5°$ C. in an inert solvent to form an intermediate triaminoborane. After removal of the amine hydrochloride salt, the intermediate is polymerized via thermal condensation at a temperature between 380°–420° C. The polymerization process is controlled so as to yield a polymer that is soluble in toluene (and other solvents) in amounts of up to 50% (w/w) and at the same time so that it is not very volatile or sensitive toward moisture. Polymerization is monitored by string temperature. (Equivalent to melting point.) The polymerized material is 'refined', that is, unreacted monomer, low molecular weight polymers and other volatile impurities are removed by purging the resin with dry nitrogen at polymerization temperatures and during the cool down. The polymer, in the form of a glassy resin, is then dissolved in an organic solvent such as toluene or xylene at a 1 to 20% (wt/wt) level. Cyclohexamine (5%) or the like material is added to the solution of the polymer in toluene to stabilize the solution against precipitation of certain components from the solution during the spin-on application of the material on to the silicon wafers. A suitable commercially available surfactant is added to the solution to impart suitable properties for the formation of defect-free films of uniform thickness, by the spin-on technique. The surfactant is used at about 0.1% (w/v) level. The resulting solution is then filtered through 0.2 micrometer filters.

In accordance with the invention, the polymers derived from the borazines are of two general types:

(1) polymers with borazine rings linked directly between a boron in one of the six-membered boron/nitrogen ring and a nitrogen atom in the adjacent six-membered boron/nitrogen ring.

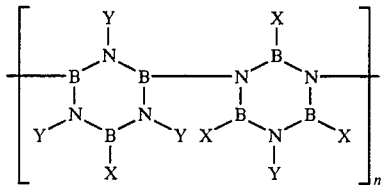

and (2) polymers, at leat a substantial portion of whose backbone is borazine rings linked via other (different) groups A, i.e.:

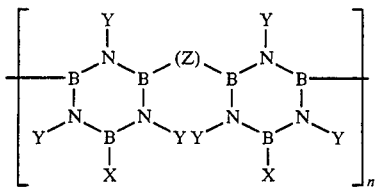

wherein Z is selected from the group consisting of $-N(R)-$, $-O-$, $-N(R)-R^1-N(r)-$, and $-R-$, and wherein R and $R^1$ denote organic radicals of 1 to 10 carbon atoms and X and Y are radicals selected from the group consisting of hydrogen, alkyl radicals of 1–8 carbon atoms, unsubstituted aromatic radicals, heterocyclic aromatic, 1–6 carbon atom alkyl substituted heterocyclic aromatic, amino, hydroxy, alkoxy and halogen radicals.

These borazine polymers can be produced as homopolymers from a single monomeric borazine or as copolymers from two different borazines utilizing a variety of synthetic routes known to those skilled in the art of which the English, et al., U.S. Pat. No. 3,166,520 and Aubrey, et al., JCS (1959) pp. 2927-31 are illustrative references. Thus, homopolymers can be produced from the thermal polymerization of B-amino borazines (two or three $-NHR-$ or $-NR_2$ groups) or thermal polymerization of borazines with X and Y being selected from the group above defined. Similarly, copolymers can be made by reacting two different borazines wherein X and Y are chosen as above defined. Copolymers can also be produced by reacting B-amino and B-halogen borazines with a wide variety of aliphatic, aromatic, and heterocyclic diamines. A borazine copolymer can be produce from the reaction of a cyclic methy-amino-borane trimer with a diene or polyene. B-halogen borazines can be copolymerized with N-lithiated borazines, and borazine copolymers with rings linked via oxygen can be made by the controlled hydrolysis of B-halogen borazines. It will be apparent that the foregoing are not all inclusive and that other borazine polymers within the above definition are intended.

In employing the borazine polymers of the invention, the traditional advantages of a spin-on dopant are maintained i.e., greater uniformity, less capital cost, higher throughput, more control, and less cleaning of diffusion tubes and boats.

The invention will be further described by the following specific examples, the details of which, it will be understood, are given primarily for purpose of illustration and the invention in its broader aspect is not limited thereto.

EXAMPLE 1

In accordance with the invention, and as shown by the reaction below, boron trichloride ($BCl_3$) (36 g, 0.3 moles) gas is added to a $-5°$ C. to $-60°$ C. solution of cyclohexyl amine (195 g, 2.0 moles) dissolved in 2 liters of petroleum ether (bp 30°–60° C.). The reaction results in the formation of a triaminoborane, $B(NHCy)_3$ (where $Cy=C_6H_{11}$, cyclohexyl), and the cyclohexylamine hydrochloride salt. After the salt is removed by filtration, the triaminoborane is heated under a nitrogen atmosphere to 300° C. for 1–2 hours to form a monomeric intermediate and thereafter heated to 380°–420° C. over a 2–4 hour period, during which time a condensation polymerization occurs and amine is evolved. After cyclohexylamine has been evolved to the desired extent that indicates the specific degree of polymerization desired, dry $N_2$ gas is sparged through the molten resin while it is cooling down to room temperature. A glassy resin (string temperature 140°±30° C.) is formed upon cooling; this amber solid is dissolved in toluene (xylene may also be used) at the 1 to 20% (wt/wt) level. To the solution is added 5% (v/v) of cyclohexylamine and 0.05–0.10% (w/v) of a fluorinated alkyl ether surfactant available commercially as FC-430 from the 3M Co.

The resulting product is a dark amber to almost black solution.

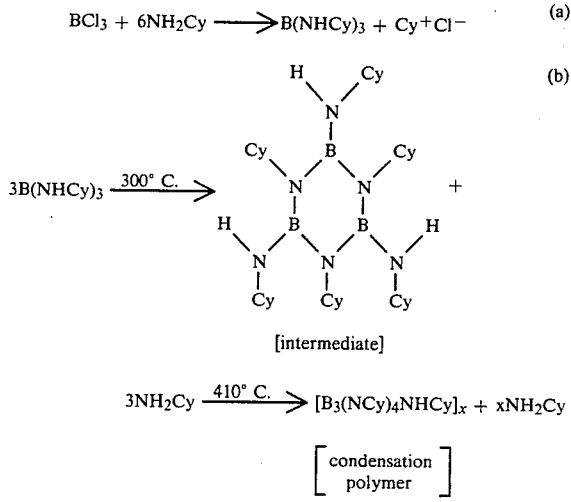

$$3NH_2Cy \xrightarrow{410°\ C.} [B_3(NCy)_4NHCy]_x + xNH_2Cy$$

$$\begin{bmatrix} \text{condensation} \\ \text{polymer} \end{bmatrix}$$

EXAMPLE 2

The procedure of Example 1 is repeated except that 186 g (2.0 moles) of aniline is used in place of cyclohexylamine. The aniline reacts to form the triaminoborane $B(NHPh)_3$ ($Ph=-C_6H_5$) which is polymerized under the same conditions as in Example 1 to yield $[B_3(NPH)_4(NHPh)]_x$.

EXAMPLE 3

The procedure of Example 1 is repeated except that 90 g (2.0 moles) of ethylamine is used in place of cyclohexylamine. The ethylamine reacts to form $B(NHEt)_3$ which is polymerized at a temperature between 320° C. and 360° C. to produce $[B_3(NEt)_4(NHEt)]_x$ wherein $Et=-C_2H_5$.

EXAMPLE 4

In applying the polymeric composition to substrates, 2–6 ml of the solutions prepared in accordance to Example 1 (and Example 2 and 3), are spun-on by dispensing the polymeric solution onto the surface of a silicon wafer and the wafer rotated at 2,000–10,000 rpm, which results in thin films (100–7000 A) of the polymer. The treated wafers, which may be held for up to 24 hours, are placed in a diffusion furnace and the wafer diffused according to one of the following procedures.

Film Diffusion

It will be understood by those skilled in the art that diffusion times, temperatures, furnace ambients, and exact processes may vary. Described below are: two typical bipolar base diffusion processes (a) and (c); a bipolar isolation diffusion (b); and a metal oxide silicon (MOS) source/drain diffusion (d).

(a) A conventional two-step diffusion process involves a predeposition step under nitrogen at temperatures between 850° C. and 1000° C. for diffusion times up to 1 hour to achieve sheet resistivities from 15–275 ohms per square. This predeposition step is followed by a deglazing step in concentrated aqueous HF, and a drive step at 1050° C.–1200° C. for 1–2 hours under an atmosphere selected from oxygen, wet oxygen and nitrogen and mixtures thereof.

(b) A less conventional one-step diffusion process involves a predeposition stage that begins under a nitrogen atmosphere at 850°–1000° C. for 5–60 minutes and is immediately followed by a wet oxygen stage at a slightly lower temperature for 5–45 minutes. The final stage of this one step (single diffusion tube) process involves raising the temperature to 1050°–1200° C. and diffusing the film for 1–2 hours under an atmosphere of oxygen, wet oxygen and nitrogen ambients and mixtures thereof. This one step process eliminates the HF deglazing step as well as the utilization of two (or more) diffusion tubes that would be required in procedure (a).

(c) A bipolar isolation diffusion is effected as in procedure (a), but higher predeposition temperatures (1100° C.–1200° C.) are employed to yield sheet resistivities of 1–4 ohms per square.

(d) A complementary CMOS or positive MOS (PMOS) source/drain diffusion can also be carried out as in procedure (a) with the drive step omitted. In a typical run, at a temperature of 935° C. for 1 hour under a $N_2$ atmosphere, sheet resistivities of 40 ohms per square at a junction depth of 0.4 microns can be achieved.

Industrial Applicability

The boron-nitrogen product prepared in accordance with the invention may be applied effectively as a boron source film for both base and isolation diffusion applications for bipolar integrated circuits and evaluated for absolute sheet resistivities. A concentration of the boron nitrogen polymer product of about 0.5% to abut 5% by weight, and preferably about 1% to 2% by weight in an organic solvent is employed in applying the dopant film. The resulting products are characterized as having single crystal across-the-wafer and wafer-to-wafer resistivity uniformity as well as batch-to-batch resistivity uniformity, minimal wafer damage and staining, ease of processing, and compatibility with existing processes. In each of these areas the polymeric source film forming compositions prepared in accordance with the invention performs effectively.

This product may be used on a wide range of devices for the semiconductor fabrication industry: e.g., bipolar and MOS integrated circuits, discrete devices, photovoltaic (solar) cells, and the like. Of particular applicability is usage, of the borazine ring containing polymer composition of the invention, by manufacturers of bipolar integrated circuits for base and isolation diffusions in a manner typically described by Example 4.

It will be apparent that variations in the details presented herein may be made by those skilled in the art. Therefore, the invention is not to be limited except as set forth in the claims which follow.

We claim:

1. A method of applying a polymeric composition to semiconductor substrates comprising dispensing a polymer containing from 1 to 20 percent by weight in a volatile organic solvent of a homogeneous glassy polymer at least a substantial part of the backbone of which is selected from:

(a) polymers with borazine rings linked directly between a boron in one ring and a nitrogen atom in the adjacent ring of the formula

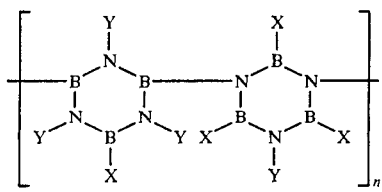

and
(b) polymers with borazine rings linked via other groups Z of the formula

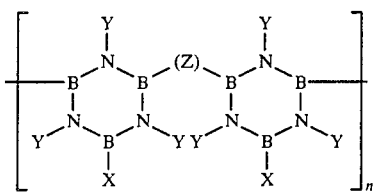

wherein X and Y locate the substituents on the ring boron and nitrogen atoms and Z is selected from the group consisting of —N(R)—, —O—, —N(R)—R$^1$—N(R)—, and —R—, wherein R and R$^1$ denote organic radicals of 1 to 10 carbon atoms and X and Y are radicals selected from the group consisting of hydrogen, alkyl radicals of 1-8 carbon atoms, unsubstituted aromatic, alkyl halogen, hydroxy and amino substituted aromatics, heterocyclic aromatics, 1-6 carbon alkyl substituted heterocyclic aromatic, amino, alkoxy and halogen radicals; rotating the wafer at 2,000-10,000 rpm, to produce a thin film, of the order of 100-7000 Å of the polymer on the substrate; heating the treated wafer in a diffusion furnace for 0.5-2.0 hours at 850° C.-1100° C. in a nitrogen ambient; deglazing the heated substrate in HF; and heating the substrate at elevated temperature of 1050° C.-1200° C. for 1-2 hours under an atmosphere selected from oxygen, wet oxygen and nitrogen ambients and combinations thereof.

2. A method of doping semiconductor material comprising:
(a) spinning a semiconductor substrate
(b) simultaneously depositing on said substrate a solution of at least 1.0% by weight of a glassy resin derived from the polymerization of a monomer of the formula

B(NHR)$_3$ wherein R is selected from the group consisting of alkyl radicals of 1-4 C atoms, cyclohexyl, phenyl, and methyl-and ethyl-substituted phenyl, radicals.
(c) heating said deposition until the solvent present in said solution is substantially volatilized; and
(d) and polymerizing said resin deposition to a glassy insoluble state.

3. The method of claim 2 wherein said deposited solution has a resin concentration of from about 1.0% to about 40% by weight.

4. The method of either of claim 2 wherein R is cyclohexyl.

* * * * *